United States Patent [19]
Cheng et al.

[11] Patent Number: 5,304,248
[45] Date of Patent: Apr. 19, 1994

[54] PASSIVE SHIELD FOR CVD WAFER PROCESSING WHICH PROVIDES FRONTSIDE EDGE EXCLUSION AND PREVENTS BACKSIDE DEPOSITIONS

[75] Inventors: David Cheng, Sunnyvale; Mei Cheng, Cupertino, both of Calif.

[73] Assignee: Applied Materials, Inc., Santa Clara, Calif.

[21] Appl. No.: 823,942

[22] Filed: Jan. 22, 1992

Related U.S. Application Data

[63] Continuation-in-part of Ser. No. 622,664, Dec. 5, 1990, abandoned.

[30] Foreign Application Priority Data

Dec. 4, 1991 [JP] Japan .................................. 3-320551

[51] Int. Cl.⁵ .............................................. H01L 21/00
[52] U.S. Cl. .................................... 118/728; 118/715; 118/719; 156/345; 156/643
[58] Field of Search ............... 118/728, 732, 719, 715, 118/723; 156/345, 643

[56] References Cited

U.S. PATENT DOCUMENTS

| | | | |
|---|---|---|---|
| 4,842,683 | 6/1989 | Cheng et al. | 156/345 |
| 4,931,135 | 6/1990 | Horiuchi et al. | 156/345 |
| 4,932,358 | 6/1990 | Studley et al. | 118/728 |
| 4,951,601 | 8/1990 | Maydan et al. | 118/719 |
| 4,962,727 | 10/1990 | Harada | 118/723 |
| 4,963,393 | 10/1990 | Goela et al. | 427/248.1 |
| 4,963,713 | 10/1990 | Horiuchi et al. | 156/345 |
| 4,978,412 | 12/1990 | Aoki et al. | 118/728 |
| 4,990,374 | 2/1991 | Keeley et al. | 427/255.1 |
| 5,013,400 | 5/1991 | Kurasaki et al. | 156/345 |
| 5,033,407 | 7/1991 | Mizuno et al. | 118/715 |

FOREIGN PATENT DOCUMENTS 434227 6/1991 European Pat. Off. .
448346 9/1991 European Pat. Off. .
2196019 4/1988 United Kingdom .

OTHER PUBLICATIONS

European Search Report EP 91120906.2.

Primary Examiner—Brian E. Hearn
Assistant Examiner—George Goudreau
Attorney, Agent, or Firm—Birgit E. Morris

[57] ABSTRACT

An improved apparatus for CVD processing is described wherein a wafer mounted on a vertically movable susceptor beneath a gas outlet or showerhead is raised into contact with a shield ring which normally rests on a ring support in the chamber. The shield ring engages the frontside edge of the wafer, lifting the shield ring off its support, when the susceptor and the wafer 10 are raised to a deposition position in the chamber. The shield ring, by engaging the frontside edge of the wafer, shields the edge of the top surface of the wafer, as well as the end edge and the backside of the wafer, during the deposition. Matching tapered edges, respectively, on the susceptor and the shield ring permit alignment of the shield ring with respect to the susceptor, and alignment of the wafer to the susceptor and the shield ring. Alignment means are also disclosed to circularly align the shield ring to its support in the chamber. Multi-unit shield rings permit the use of wider shield rings and prevent cracking of the shield ring due to thermal stresses caused by temperature differences near and away from the wafer during processing. These shield rings may also have tapered edges to ensure alignment of the rings with respect to each other.

40 Claims, 4 Drawing Sheets

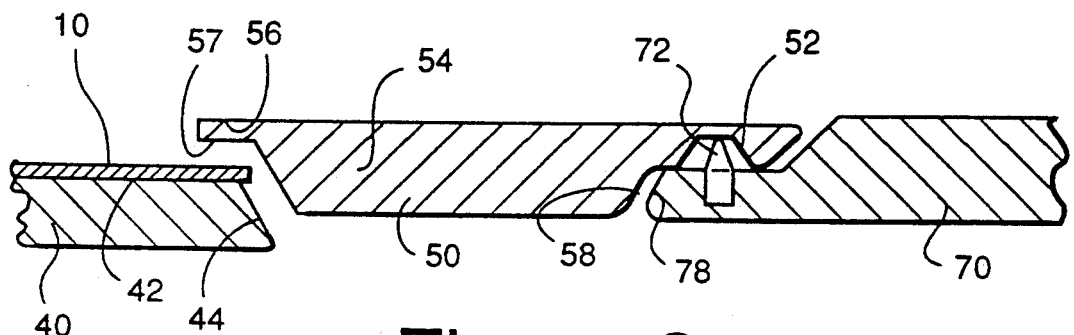
Figure 3
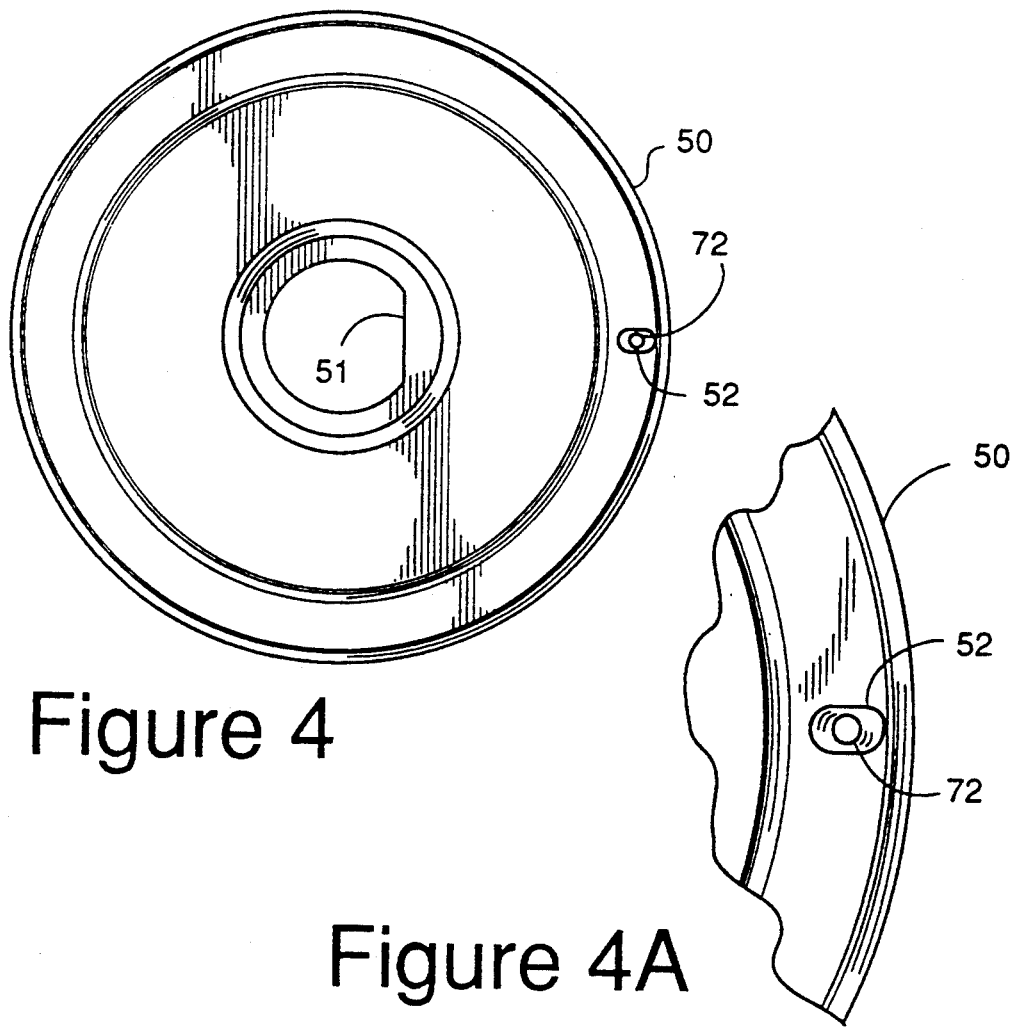
Figure 4
Figure 4A

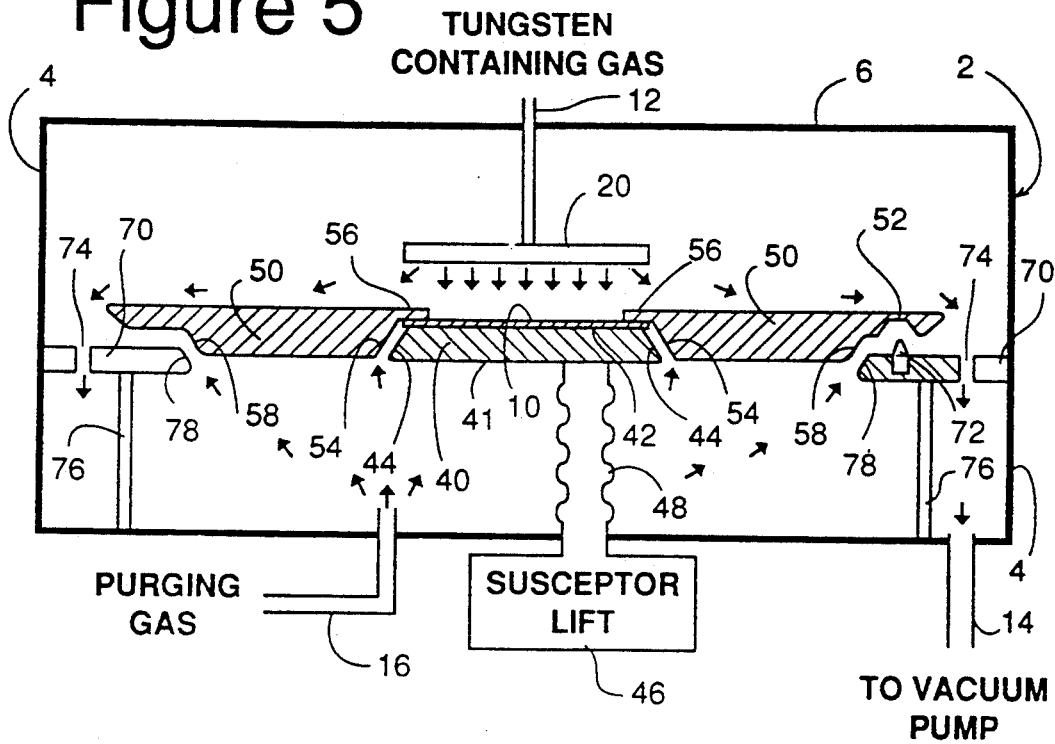
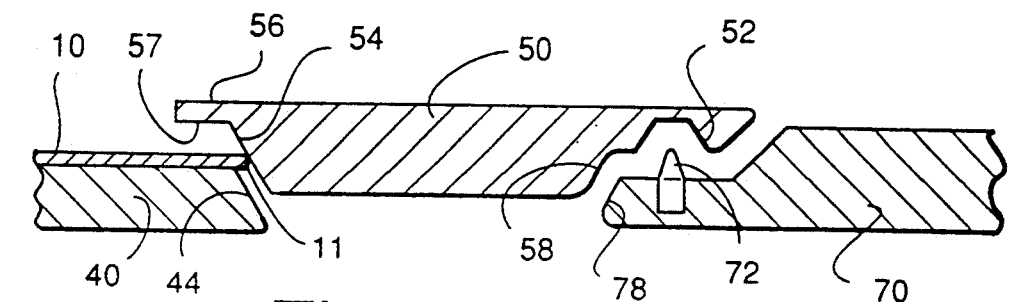

PASSIVE SHIELD FOR CVD WAFER PROCESSING WHICH PROVIDES FRONTSIDE EDGE EXCLUSION AND PREVENTS BACKSIDE DEPOSITIONS

This application is a continuation-in-part of copending application Ser. No. 07/622,664 filed Dec. 5, 1990, now abandoned.

BACKGROUND OF THE INVENTION

1. Field of the Invention

This invention relates to apparatus for CVD processing of a semiconductor wafer. More particularly, this invention relates to a shield which provides frontside edge exclusion of deposited materials on a semiconductor wafer during CVD processing as well as preventing backside depositions.

2. Description of the Related Art

In the deposition of materials on a semiconductor wafer during the formation of an integrated circuit structure, it is desirable to exclude deposited materials from the backside of the wafer, as well as from the edges of the front surface and the end edges of the wafer. This is of particular importance where the deposited material does not adhere to the native oxides usually present on such surfaces, which may require prior processing of such surfaces to promote adhesion.

For example, when tungsten is deposited over a silicon oxide insulation layer on a semiconductor wafer by CVD processing, the oxide surface must be pre-treated before the tungsten being deposited will properly adhere to the surface, e.g., by depositing a titanium tungsten (TiW) or titanium nitride (TiN) layer on the oxide surface. When tungsten deposits on the edges of the front surface of the wafer, or on the backside of the wafer, (which surfaces have not been pretreated with TiW or TiN) the deposited tungsten does not adhere properly, and flakes off as particles. As is well known, the generation of particles has a deleterious effect on subsequent wafer processing.

As shown in FIG. 1, in prior art deposition apparatus for CVD processing of a wafer, deposition gas or gases, containing a material such as tungsten to be deposited onto the front or top surface of a semiconductor wafer 10, enters the CVD chamber through a gas inlet or "showerhead" 20 which as shown is positioned above the wafer 10. A pumping ring 24 is located on a supporting lip or shoulder 26 of the chamber and has an inner diameter (ID) selected, with respect to the outer diameter (OD) of a circular susceptor 30 on which wafer 10 rests, to control the flow therebetween of a nonreactive purging gas from beneath the susceptor 30. The purpose of the purging gas flow is to inhibit passage of the deposition gas toward the edge and/or backside of the wafer, i.e., to help prevent unwanted deposition on such surfaces.

Unfortunately, however, it has been found that even when using such prior art apparatus, materials such as tungsten may still deposit on the frontside edges, end edges, and backside of the semiconductor wafer during deposition by CVD processing.

Studley et al, U.S. Pat. No. 4,932,358, in addressing this problem, discloses a seal ring which presses down against a wafer on a CVD chuck continuously around the outer periphery of the wafer and with sufficient force to hold the backside of the wafer against the chuck. The seal ring has one surface which contacts the front of the wafer and a second surface that extends close to the chuck, which is larger than the wafer, so that the edge of the wafer is also excluded from CVD coating. However, a complicated mounting mechanism is required to move the seal ring in and out of clamping engagement with the wafer and to maintain alignment between the seal ring and the wafer. Further, the seal ring can only be as wide as the diameter of the chuck.

It would, therefore, be desirable to provide simplified seal ring means which would engage a semiconductor wafer to protect the edges and backside of the wafer from undesirable depositions on such surfaces of the wafer.

SUMMARY OF THE INVENTION

It is an object of this invention to provide shield means which will engage the frontside edge of a semiconductor wafer to inhibit deposition gases from coming into contact with such frontside edge surfaces, as well as the end edge and backside of the wafer, when said shield means and the periphery of the wafer are in contact with each other.

It is another object of this invention to provide shield means comprising a shield ring with a tapered inner edge which will center the wafer with respect to the shield ring when the wafer and shield ring are in contact with each other.

It is a further object of this invention to provide shield means comprising a shield ring with a tapered inner edge and a susceptor with a matching tapered outer edge which will center the shield ring with respect to the susceptor, when the wafer and shield ring are in contact with each other.

It is yet a further object of this invention to provide shield means which will engage the frontside edge of a semiconductor wafer to protect the frontside edge surfaces, as well as the backside of the wafer, from undesirable depositions during CVD processing of the wafer, and support means for the shield means when the wafer and shield ring are not in contact with each other.

It is still a further object of this invention to provide shield means which will engage the frontside edge of a semiconductor wafer to protect the frontside edge surfaces, as well as the backside of the wafer, from undesirable depositions during CVD processing of the wafer, support means for the shield means when the wafer and shield ring are not in contact with each other, and alignment means associated with the shield means and the support means to align the shield means both laterally and rotationally with respect to the support means when the shield means rests on the support means.

It is yet another object of this invention to provide shield means that will engage the frontside edge of a semiconductor wafer to protect the frontside edge surfaces, as well as the backside of the wafer, from undesirable depositions during CVD processing of the wafer that has reduced particle generation.

It is a still further object of the invention to provide a shield means that has reduced susceptibility to thermal stress caused by temperature differences in various portions of said chamber during processing.

These and other objects of the invention will be apparent from the following description and accompanying drawings.

BRIEF DESCRIPTION OF THE DRAWINGS

FIG. 3 is an enlarged fragmentary vertical cross-section of a portion of the apparatus shown in FIG. 2, showing the non-engagement of the shield means by the wafer and wafer support and showing the shield means resting on shield support means.

FIG. 4 is a bottom view of the shield ring of the invention showing a rotational alignment slot and an alignment pin on the shield support means in the slot.

FIG. 4A is an enlarged fragmentary view of the shield means of FIG. 4, showing the alignment slot and pin therein.

FIG. 5 is a vertical cross-sectional view of the CVD processing apparatus of FIG. 2 with the wafer support and wafer thereon shown in a raised position of engagement with the shield means which has been lifted above the shield support means.

FIG. 6 is an enlarged fragmentary vertical cross-section of a portion of the apparatus shown in FIG. 5, showing engagement of the shield means by the wafer and wafer support means and showing the shield means in non-contact with the shield support means.

FIG. 7 is an enlarged fragmentary vertical cross sectional view of a portion of the apparatus shown in FIG. 2 with the wafer shown in an offset or skewed position and being engaged by the tapered edge of the shield means to urge the wafer back into an aligned position.

DETAILED DESCRIPTION OF THE INVENTION

Figure 1:
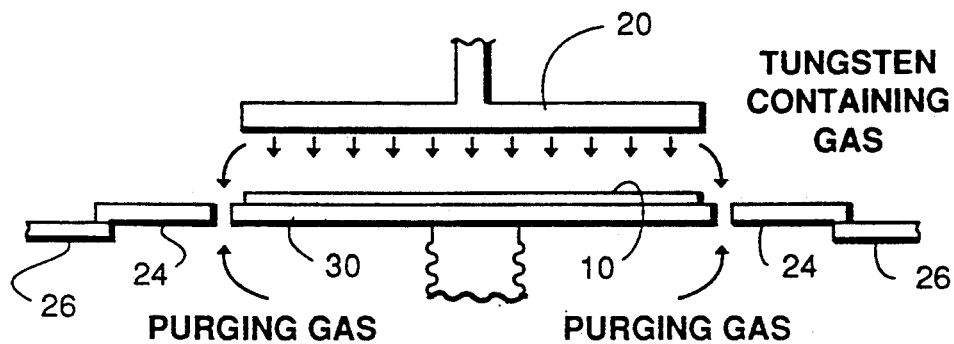
FIG. 1 is a fragmentary vertical cross-sectional view of prior art apparatus used in the CVD processing of semiconductor wafers.
Figure 2:
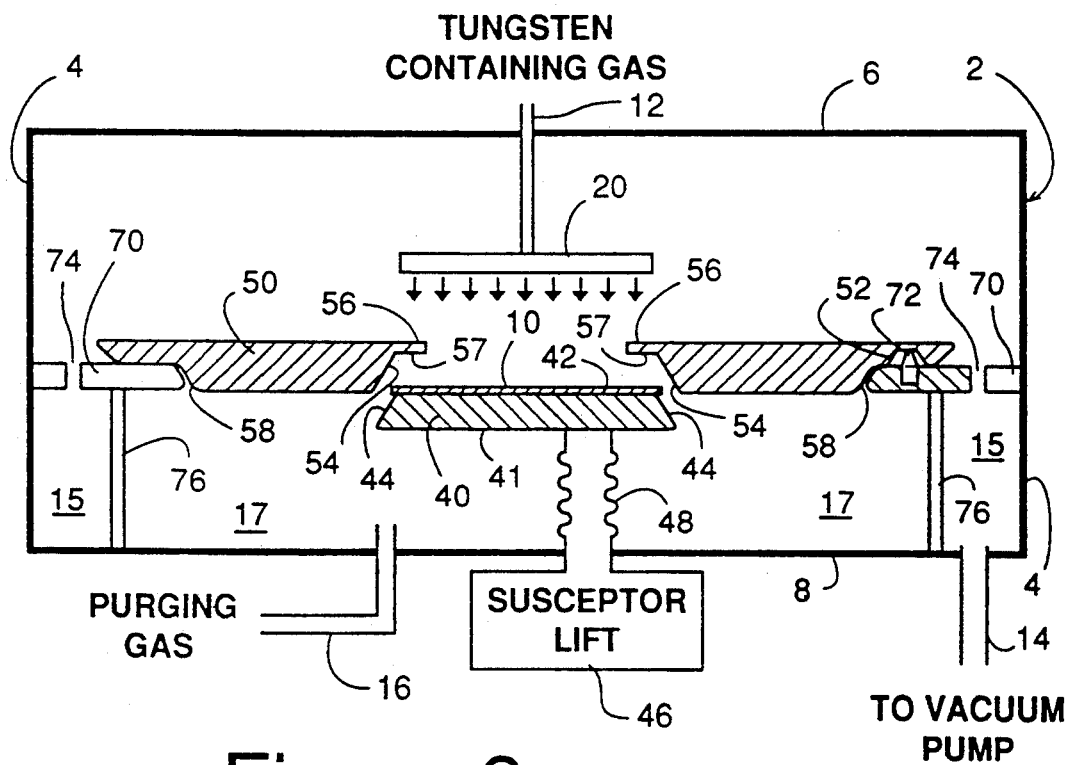
FIG. 2 is a vertical cross-sectional view of CVD processing apparatus constructed in accordance with the invention with a wafer support bearing a semiconductor wafer thereon shown in a lowered, non-engaged position with a shield means resting on support means.

Referring now to FIGS. 2-6, and in particular to FIGS. 2 and 5, a vacuum deposition chamber capable of CVD processing is generally indicated at 2. The chamber 2 contains a wafer 10 mounted on a vertically movable wafer support or susceptor 40 beneath a gas outlet or showerhead 20 through which process gas enters chamber 2. A shield ring 50, which normally rests on shield support means 70 in the chamber 2, engages the frontside edge of the wafer 10 when the susceptor 40 and the wafer 10 are raised to a deposition position in chamber 2, as shown in FIGS. 5 and 6. The shield ring 50, by engaging the frontside edge of the wafer 10, shields the edge of the top surface of the wafer 10, as well as the end edge and the backside of the wafer 10, from the deposition gases as will be explained in more detail below.

The chamber 2 may comprise one chamber of a multiple chamber integrated processing system for performing a number of process steps on a semiconductor wafer in a plurality of interconnected vacuum processing chambers. Such a multi-chamber integrated process system is disclosed and claimed in Maydan et al, U.S. Pat. No. 4,951,601, assigned to the assignee of this invention, cross reference to which is hereby made.

The chamber 2 includes sidewalls 4, a top wall 6 and a bottom wall 8. Process gas entering the inlet tube 12 in the top wall 6 is discharged into the vacuum chamber 2 through the showerhead 20 which, as shown, is positioned above the wafer 10. Purging gas enters the chamber 2 from an inlet port or tube 16 through the bottom wall 8. A vacuum port 14, leading to a vacuum pump, may also be located in the bottom wall 8. The support means 70 for the shield ring 50 may be connected to the bottom wall 8 or the sidewalls 4 of the chamber 2.

A sleeve or skirt member 76 depends downwardly from the support means 70 to the bottom wall 8 to divide the bottom portion of the chamber 2 into an outer portion 15 of the chamber 2, in communication with the vacuum port 14, and an inner portion 17 into which the purge gas flows from the inlet 16. Pumping holes or openings 74 in the support means 70 permit both process gas and purge gas to enter the outer portion 15 from which they are pumped out of the chamber 2 via vacuum port 14.

A susceptor 40, on which the wafer 10 is supported in the chamber 2, comprises a disk-like member having a broad base or bottom surface 41 with a tapered sidewall 44 leading to a narrower top surface 42 which is designed to be approximately equal in diameter to the diameter of the wafer 10 at the deposition temperature, e.g., at a temperature ranging from about 200° C. to about 700° C.

The susceptor 40, as shown, is movable vertically within the chamber 2 via lift means which may comprise, by way of example and not of limitation, fluid power means 46 and an expandable lift tube means 48 having bellows to permit vertical expansion of the tube means 48 when hydraulic or pneumatic fluid is pumped into lift tube means 48 by fluid power means 46. FIG. 2 shows lift tube means 48 in a retracted position, resulting in the susceptor 40 and the wafer 10 thereon being in a lowered position (as seen in both FIGS. 2 and 3). FIG. 5, in contrast, shows lift tube means 48 in an expanded position to raise the susceptor 40 and the wafer 10 thereon into position below the showerhead 20 for CVD processing to deposit the desired material onto the wafer.

In accordance with the invention, when the susceptor 40 and the wafer 10 thereon are raised to the operating or deposition position, as shown in FIGS. 5 and 6, the frontside edge (the edge of the top surface) of the wafer 10 engages the undersurface of an inner lip 56 of the shield ring 50 and lifts the shield ring 50 up from the support means 70 on which the shield ring 50 normally rests when not engaged by the wafer 10.

The shield ring 50, as seen in the top view of FIG. 4, is generally circular or doughnut shaped, having a generally circular central opening with a flat edge 51 on one side of the central opening corresponding to the conventional orientation flat found on semiconductor wafers.

The shield ring 50 may be formed of a metal such as aluminum, stainless steel, nickel, monel or any other metal which would be compatible with other materials used in the construction of the deposition apparatus, i.e., the walls, the susceptor, the showerhead, etc. which are all conventionally made of aluminum or stainless steel. Preferably, however, the shield ring 50 will be constructed of a non-metallic material which: (1) will be compatible with the operating temperature employed during the processing, (2) will be compatible with the vacuum conditions in the chamber, i.e., will not outgas, and (3) will be chemically inert, i.e., nonreactive, with the materials used in the deposition process.

Since materials used in the deposition process may also deposit on the shield ring, necessitating cleaning of the ring, the shield ring 50, in the preferred embodiment, should be constructed of a ceramic material such as, for example, aluminum oxide, magnesium oxide, silicon nitride, boron nitride, zirconium oxide, magnesium fluoride, or quartz. The shield ring 50 could also be constructed of a base material, e.g., aluminum, and then coated or clad with a covering of a non-metallic material meeting the above criteria, such as the above described ceramic materials, or an anodized coating of the base metal, e.g., a coating of aluminum oxide formed on an aluminum shield ring by anodizing it.

The central opening of the shield ring 50 is provided with a tapered inner edge 54 on the lower surface of the ring 50 having approximately the same angle of taper as the tapered outer edge 44 of the susceptor 40, i.e., a matching taper. The tapered inner edge 54 terminates, at its upper end, at the inner lip 56. The inner lip 56, in turn, is dimensioned to inwardly extend circumferentially from the tapered inner edge 54 a predetermined distance to extend over the frontside edge of the wafer 10. The inner lip 56 has an undersurface 57 which is flat and parallel to the surface of the wafer 10 to permit flat contact therebetween and to provide a seal to inhibit passage of process gases therebetween.

The minimum amount or extent of coverage of the frontside or top surface edge of the wafer 10 by the inner lip 56 of the shield ring 50 will be an amount sufficient to at least provide a seal therebetween which will prevent process gases from reaching the end edge and rear surface of the wafer 10. The actual amount of coverage of the front side edge of the wafer 10 by the inner lip 56 of the shield 50 will be further governed, at least in some deposition processes, by the extent of coverage of the top surface of the wafer 10 by previous processing steps. For example, when depositing tungsten on a silicon oxide surface of a wafer 10, i.e., either the oxide-coated surface of the substrate itself or an oxide coating on previously formed epitaxial silicon or polysilicon surfaces, the silicon oxide must be pretreated with another material, e.g., TiW or TiN, to provide proper adherence of the tungsten layer, and to prevent particles of tungsten from flaking off. If such a pretreatment step did not extend to the end edge of the wafer, then the area not so pretreated must be covered by the inner lip 56 of the shield ring 50 to prevent deposition and resultant particle formation on such unprotected surface. The inner lip will, therefore, usually be dimensioned to extend inwardly over the front side edge of the wafer a distance of from about 1.5 to about 6 millimeters (mm), typically about 5 mm, to provide the desired sealing and front side edge shielding.

The ID of the top portion of the tapered inner edge 54 on the shield ring 50 is just slightly larger than the OD of the top surface 42 of the susceptor 40 by approximately the same amount. This tolerance is provided for at least two reasons. First, the tolerance is provided to compensate for possible differences in thermal expansion when different materials are respectively used in constructing the susceptor 40 and the shield ring 50. The tolerance is also provided to ensure that as the susceptor 40 and the wafer 10 thereon are lifted into contact with the shield ring 50, the shield ring 50 will not be supported by contact between the tapered inner edge 54 of the shield ring 50 and the tapered outer edge 44 of the susceptor 40, but rather by contact of the underside of the inner lip 56 with the top surface of the wafer 10 to enhance the sealing therebetween.

By tapering the outer edge 44 of the susceptor 40 and the inner edge 54 of the shield ring 50 by the same angle, an angle which will usually be about 30° but which may vary from about 15° to about 60°, i.e., by providing matching tapers, any possible misalignment of the shield ring 50 with respect to the susceptor 40 (and the wafer 10 thereon) may be corrected by contact between the respective tapered surfaces which will cause shield ring 50 to laterally shift or slide back into alignment with the susceptor 40.

The tapered edge 54 of the shield ring 50 serves an additional function in the potential lateral alignment of the wafer 10, should the wafer 10 not be positioned on the susceptor 40 in coaxial alignment therewith As seen in FIG. 7, when the wafer 10 is misaligned with respect to the susceptor 40, the edge 11 of the wafer 10 extending beyond the top surface 42 of the susceptor 40 will come into contact with the tapered edge 54 of the shield ring 50 as the susceptor 40 and the wafer 10 are raised into position. The relatively light weight of the wafer 10 with respect to the weight of the shield ring 50 will cause the wafer 10 to shift laterally to realign the wafer 10 with the susceptor 40 as the susceptor 40 and the wafer lo thereon continue to rise into the processing position.

The shield ring 50 is supported in the chamber 2, when not in engagement with the susceptor 40 and the wafer 10, by resting on a support means 70 which may comprise a circular shoulder or support bracket secured to the sidewall 4 of the chamber 2. Alternatively, support means 70 may itself comprise a ring which is, in turn, supported by a rigid support secured to the sidewall 4 of the chamber 2.

In a preferred embodiment, the shield ring 50 is maintained in rotational alignment with the support means 70 by alignment means carried on the under surface of the shield ring 50 and the upper surface of the support means 70 which interact when the susceptor 40 and the wafer 10 are lowered out of engagement with the shield ring 50, i.e., the position shown in FIGS. 2 and 3. As shown in those figures (as well as in FIGS. 4, 4A, 5 and 6) the alignment means may comprise a beveled or tapered pin 72 on the upper surface of the support means 70 which is received in a similarly beveled or tapered slot opening 52 which is formed in the undersurface of the shield ring 50 and which extends radially outward. As the shield ring 50 is lowered onto the support means 70, if the shield ring 50 is rotationally misaligned with respect to the support means 70, the respective beveled side edges of the pin 72 and the opening 52 will contact one another and move the shield ring 50 back into rotational alignment so that the flat portion 51 maintains the same orientation.

As shown in FIG. 7, the shield ring 50 may also be provided with a tapered outer surface or edge 58 along at least the lower portion of the outer edge of the shield ring 50 which matches a similarly tapered inner edge 78 provided on the support means 70. When the shield ring 50 has been raised off the support means 70 by the susceptor 40, the tapered edges 58 and 78 cooperate to provide a passageway for purging gas or gases, i.e., nonreactive gases such as argon, helium or the like, to pass through from below the wafer 10 in the chamber 2, as shown in FIG. 5. The purging gas pressure can be maintained somewhat higher than the reaction or deposition gas pressure, thereby ensuring a purging gas screen around the wafer. Such purging gases act to confine the process or deposition gases in the chamber 2 to the volume above the wafer 10 to facilitate the deposition thereon and to inhibit deposition gas molecules from passing into the area around the backside of the wafer or to other areas in the chamber 2 where they are not desired.

It should be further mentioned, in this regard, that while the purging gas does not usually pass between the end edge of the wafer 10 and the inner edges of the shield ring 50 in the structure of the invention, should there be any passageway or opening between the wafer and the shield ring, i.e., should an incomplete seal be formed between the frontside edge or the wafer 10 and the undersurface 57 of the lip 56 of the shield ring 50, the purging gas will pass through such openings, thereby inhibiting the undesirable passage of process gases through such openings to the shielded portions of the wafer 10, i.e., to the frontside edge, end edge and the backside of the wafer 10.

The above description has been made showing a single unit ring shield means of the invention. Since it is desired to move the reactant gases as far as possible from the area of the underside of the wafer being processed, it is desirable to utilize a ring shield that is as wide as possible, i.e., that covers most of the area between the wafer on the susceptor and the sidewalls of the CVD chamber. However, as the shield means becomes wider, it becomes subject to thermal stresses due to the temperature differences between the temperature near the wafer and susceptor, which is generally higher than the remainder of the chamber, and the temperature near the sidewalls of the chamber, which is generally lower than that of the wafer. These thermal stresses may result in cracking of metal and ceramic parts. When the shield means cracks, of course processing gases can reach the top, side edge and bottom side of the wafer. Further, as the ring shield is exposed to differing temperatures, it is subject to changes of dimensions, causing the ring shield to rub against the wafer and against the ring shield support. This rubbing result in particle generation, particularly when the ring shield is made of a material such as aluminum. As is well understood, the generation of particles in a CVD chamber is to be avoided. The multi-unit ring shields of the invention discussed hereinbelow in greater detail, can be made of ceramic which is a much harder material than aluminum for example, and that is much less likely to generate particles within the chamber. Since the width of each unit of a multi-unit ring shield can be optimized with respect to temperature differences at different places within the chamber, cracking can also be eliminated.

Figure 8:
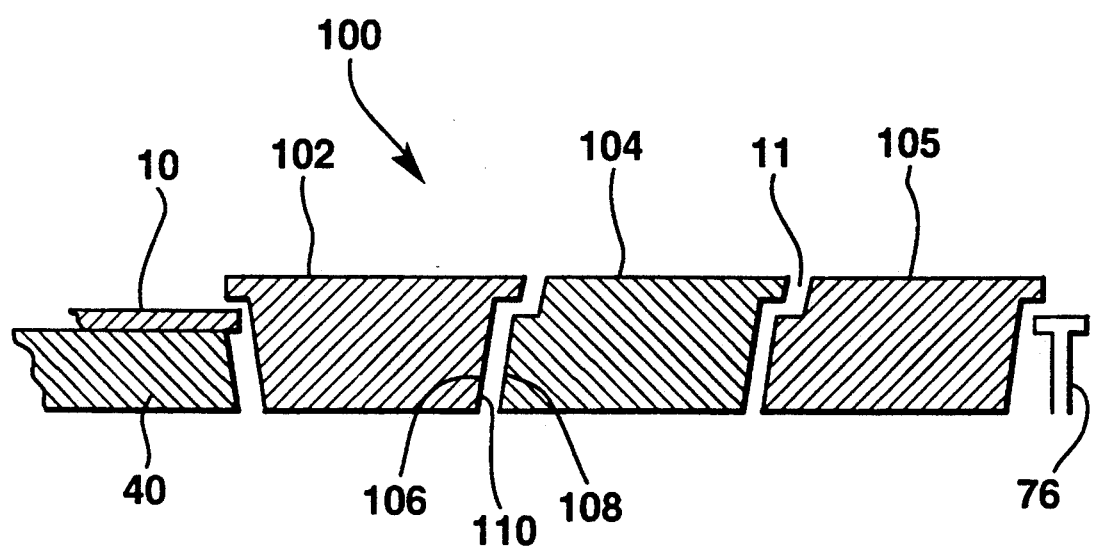
FIG. 8 is an enlarged fragmentary vertical cross-section of a portion of a multi-unit shield ring showing engagement of the innermost shield ring by the wafer and wafer support and showing the outermost shield ring in non-contact with the shield support means.

FIG. 8 shows a preferred embodiment of a multi-unit ring shield 100. The ring shield 100 as shown in FIG. 8 comprises an inner ring 102, an adjacent ring 104 and outermost ring 105. The side 106 of the inner ring 102 away from the Wafer and the side 108 of the outer ring 104 adjacent to the inner ring are tapered in complementary manner so that when in contact with each other, the inner ring 102 fits onto and forms a seal with the adjacent ring 104. In like manner the sides of the adjacent ring 104 and the outermost ring 105 are also tapered so that when in contact with each other, the adjacent ring 104 fits onto and forms a seal with the outermost ring 105. The multi-unit ring shield 100 has the advantage that it can be made much wider without cracking than can a single unit ring shield 50.

FIG. 8 also illustrates the inner ring shield 102 in contact with the wafer 10 during processing. The opening 110 between the inner ring 102 and the adjacent ring 104 and opening 112 between the adjacent ring 104 and the outermost ring 105 allows purging gas to pass therethrough.

Thus the invention provides means for preventing or inhibiting undesirable deposition of materials on the frontside edge, end edge and backside of a semiconductor wafer during CVD processing comprising a shield ring in the deposition chamber which engages the top surface of the wafer during deposition. Matching tapered surfaces respectively on the susceptor and the shield ring permit alignment of the shield ring with respect to the susceptor, as well as permitting the wafer to be aligned to the shield ring. Optional alignment means on the shield ring and a support means used to support the shield ring when not engaged by the wafer permit alignment of the shield ring with respect to the support means. Matching tapered surfaces on the shield ring and the support means provide a purging gas passageway when the shield ring is not in contact with the support means, e.g., during processing of the wafer. Use of a multi-unit shield ring permits the use of wide area shield rings that can further remove the process gas from the underside of the wafer and decreases the likelihood of contact of the processing gas and the backside of the wafer. The multi-unit shield ring permits the use of hard, non-particle generating materials such as ceramics in the construction of wide shield rings that are not susceptible to cracking due to temperature differences within the chamber during CVD processing. A purging gas can pass between the units of the ring shield to allow a positive flow in the area of the wafer, further discouraging reactant gases from reaching the underside of the wafer.

The Figures have been explained in terms of processing a semiconductor wafer as the workpiece, but the invention is not so limited and other workpieces can be employed with concomitant and suitable changes in the configuration of the workpiece support or susceptor and the shield means. Further, although as illustrated the susceptor is moveable vertically within the processing chamber, other configurations can be used such as horizontal movement of the susceptor and the wafer.

Having thus described the invention what is claimed is:

1. Vacuum deposition apparatus for vacuum processing of a workpiece which comprises:
   a) a vacuum deposition chamber;
   b) a workpiece support means within said chamber about the same size or slightly smaller than the workpiece to be processed;
   c) a port for process gas in a wall of said chamber;
   d) moving means for moving said support means into and out of a deposition position in said chamber; and
   e) shield means for said workpiece moveable so as to engage the top and side edges of said workpiece and extending beyond the periphery of said workpiece during vacuum processing thereof to prevent deposition of materials on said top and side edges.

2. The apparatus according to claim 1 wherein said support means is provided with an outer edge which is inwardly tapered from a larger bottom surface to a top surface; and said shield means has a similar taper on its inner edge and a lip extending inwardly to engage the frontside edge of the workpiece to be processed.

3. The apparatus of claim 2 wherein said shield means comprises two or more units, an inner unit adjacent to said support means and having a lip extending both inwardly and outwardly, and an outer part having an inner edge that fits together with the outer edge of said inner unit.

4. The apparatus according to claim 2 wherein said tapered outer edge of said support means is of smaller dimension than said tapered inner edge of said shield means and of like angle, whereby said shield means may be moved into alignment with said support means by contact between said respective tapered edges as said support means and said workpiece are moved into a deposition position in said chamber.

5. The apparatus according to claim 4 wherein said support means is circular and it has an upper surface which is about the same as the diameter of said workpiece, whereby said tapered inner edge of said shield means will engage a portion of the end edge of said workpiece when said susceptor and said workpiece are moved into a deposition position in said chamber, such that, if said workpiece is axially misaligned with respect to said support means, said tapered inner edge of said shield means will urge said workpiece back into an aligned position with respect to said support means.

6. The apparatus of claim 4 wherein said tapered outer edge of said support means and said tapered inner edge of said shield means each define an angle ranging from about 15° to about 60° with respect to the vertical.

7. The apparatus of claim 2 wherein the under surface of said lip of said shield means is parallel to the surface of said workpiece and said lip extends inwardly over said frontside edge of said workpiece a distance ranging from about 1.5 to about 6 millimeters.

8. The apparatus of claim 1 wherein said shield means is supported in said chamber by shield support means attached to a wall of said chamber so that said shield means is supported thereon when it is not in engagement with said workpiece.

9. The apparatus of claim 8 wherein alignment means is carried by said shield means and said shield support means to align said shield means to said shield support means.

10. The apparatus of claim 9 wherein said alignment means comprise mating means respectively carried on the undersurface of said shield means and the upper surface of said shield support means.

11. The apparatus of claim 10 wherein said mating means comprise a pin with a tapered head and a slot extending radially on said under surface of said shield means with correspondingly tapered sidewalls to receive said tapered pin.

12. The apparatus of claim 8 wherein said shield means has an outer tapered edge which corresponds to a tapered surface on said shield support means whereby, when the shield means becomes disengaged from said support means during processing of said workpiece, a passageway is provided for purging gas introduced into said chamber from a wall thereof that is not the same as that of introduction of said process gas, to inhibit said process gas from contacting the underside of said workpiece.

13. The apparatus of claim 12 wherein a divider separates that portion of said chamber in communication with a purge gas inlet from another portion in communication with a vacuum outlet.

14. The apparatus of claim 3 wherein said shield means is made of ceramic.

15. The apparatus of claim 3 wherein said shield means shields most of the chamber from the Workpiece extending outwardly to the walls of said chamber.

16. The apparatus of claim 1 wherein a purge gas port is in a wall of said chamber that is different from the wall bearing the process gas port.

17. The apparatus of claim 3 wherein a purge gas port is in a wall of said chamber that is different from the wall bearing the process gas port.

18. The apparatus of claim 17 wherein purge gas can pass through an opening between said inner ring and said outer ring when said inner ring is engaged by said wafer.

19. In a vacuum deposition chamber for CVD processing of a semiconductor wafer comprising
 a) a vacuum deposition chamber;
 b) a circular wafer support means in said chamber having an upper surface about the same size as said wafer and a lower surface which is larger than said wafer, the walls between the surfaces having a uniform taper;
 c) gas inlet means for supplying process gas into said chamber;
 d) means for vertically moving said wafer support means toward and away from said gas inlet means; and
 e) shield means comprising a ring having a tapered inner edge with a taper angle about the same as the angle of the walls of the wafer support means, said tapered inner edge extending inwardly from the bottom surface of said ring to a bottom surface of a lip which extends inwardly to engage the frontside edge of said wafer when the wafer and wafer support means are moved toward said gas inlet means to thereby shield said frontside edge of said wafer from said processing gas and inhibit deposition thereon.

20. An apparatus according to claim 19 wherein said ring shield comprises a plurality of rings whose edges mate with each other.

21. An apparatus according to claim 20 wherein said ring shield comprises an inner ring and an outer ring, said inner ring having a lip that extends both inwardly over said wafer during processing and outwardly over said outer ring.

22. An apparatus according to claim 20 wherein the inner edge of said inner ring has a taper corresponding to the taper of the walls of said wafer support means.

23. An apparatus according to claim 20 wherein the outer edge of each ring has a taper corresponding to a taper of the inner edge of the next adjacent ring.

24. An apparatus according to claim 22 wherein the outermost ring is supported by shield support means attached to a wall of said chamber 25. An apparatus according to claim 19 wherein said shield means is supported in said chamber by ring support means attached to said chamber which permits upward movement of said shield means as said wafer support means is vertically moved upward into engagement with the undersurface of said lip on said shield means 26. An apparatus according to claim 19 wherein a purge gas inlet in a wall of the chamber that is not the same as the process gas inlet allows purge gas to pass into the chamber 27. An apparatus according to claim 25 wherein an opening is formed between said ring support means and said shield means when the shield means is disengaged from said ring support to permit said purge gas to pass into the portion of the chamber above said shield means.

28. An apparatus according to claim 20 wherein an opening is formed between an inner ring and its next adjacent outer ring when the inner ring is engaged by said wafer to permit purge gas to pass into the portion of the chamber above said shield means.

29. An improved vacuum deposition apparatus for CVD processing of a semiconductor wafer which comprises:
 a) a vacuum deposition chamber;
 b) a generally circular semiconductor wafer in said chamber;
 c) wafer support means in said chamber comprising a generally circular susceptor with an outer edge which is inwardly tapered to define an angle ranging from about 15° to about 60° to the plane of said susceptor from a larger bottom surface to a top surface which is approximately the same diameter as said wafer;
 d) process gas inlet means above said wafer on said susceptor;
 e) means for vertically moving said susceptor and wafer thereon toward and away from said gas inlet means;
 f) shield means in said chamber comprising a circular shield ring having a tapered circular inner edge of slightly larger dimension than said tapered outer edge of said susceptor, with a taper angle approximately equal to said angle of said tapered outer edge of said susceptor to provide matching tapers to permit alignment of said shield ring with respect to said susceptor and alignment of said wafer to said susceptor and said shield ring, said tapered inner edge of said shield ring extending inwardly from the bottom surface of said ring to the bottom surface of a lip on said shield ring which extends inwardly to engage from about 1.5 to about 6 mm. of the frontside edge of said wafer when said susceptor and wafer are vertically moved toward said process gas inlet means to shield said frontside edge of said wafer during CVD processing to prevent deposition on said frontside edge of said wafer, as well as the edge and backside of said wafer;
 g) shield ring support means operationally attached to said chamber to support said shield ring and to permit vertical upward susceptor and said wafer thereon are vertically moved upward into engagement with the undersurface of said lip on said shield ring; and
 h) alignment means comprising mating means respectively carried on the undersurface of said shield ring and the upper surface of said ring support means to circularly align said shield ring to said ring support means.

30. An improved vacuum deposition apparatus for CVD processing of a semiconductor wafer which comprises:
 a) a vacuum deposition chamber;
 b) wafer supporting means comprising a circular susceptor provided with an outer edge which is inwardly tapered from a larger bottom surface to a top surface which is approximately the same diameter as said wafer in said chamber;
 c) a generally circular semiconductor wafer on said susceptor;
 d) process gas inlet means in said chamber;
 e) means for vertically moving said susceptor and wafer thereon upwardly and downwardly in said chamber;
 f) circular shield means having a tapered circular inner edge extending inwardly from the bottom surface of said ring to the bottom surface of a lip on said shield ring which extends inwardly to engage the frontside edge of said wafer in said chamber when said wafer and susceptor are vertically moved upward to shield said frontside edge of said wafer during CVD processing to prevent deposition on said frontside edge of said wafer and wherein said susceptor is of smaller dimension than said tapered inner edge of said shield ring and wherein the angle of taper of said susceptor outer edge and of said shield ring inner edge are approximately equal, whereby said shield ring may be laterally moved into alignment with said susceptor by contact between said respective tapered edges as said susceptor and said wafer thereon are raised into engagement with said shield ring; and
 g) shield ring support means operationally attached to said chamber which permit vertical upward movement of said shield ring off said ring support means as said susceptor and said wafer thereon are vertically moved upward into engagement with the undersurface of said lip on said shield ring.

31. The apparatus of claim 30 wherein alignment means are carried by said shield ring and said ring support means to circularly align said shield ring to said ring support means.

32. The apparatus of claim 31 wherein said alignment means comprise mating means respectively carried on the undersurface of said shield ring and the upper surface of said ring support means.

33. The apparatus of claim 32 wherein said mating means comprises a pin with a tapered head and a slot extending radially on said under surface of said shield ring and correspondingly tapered sidewalls to receive said tapered pin.

34. The apparatus of claim 33 wherein said shield ring has an outer tapered edge which mates with a tapered surface on said ring support means to provide a purging gas passage therebetween when said shield ring is lifted off said ring support means by said susceptor and said wafer, whereby purging gas introduced into said chamber below said wafer may pass through said purging gas passage into the upper portion of said chamber.

35. The apparatus of claim 34 wherein a skirt descends downwardly from said shield ring support means to the bottom wall of said chamber to divide that portion of said chamber below said shield ring support means into an inner portion in communication with a purge gas inlet and an inner portion in communication with a purge gas inlet and an outer portion in communication with a vacuum outlet.

36. The apparatus of claim 35 wherein openings in said shield ring support means permit process gas and purge gas to flow into said outer portion of said chamber and to be evacuated from said chamber through said vacuum outlet.

37. An improved vacuum deposition apparatus for CVD processing of a semiconductor wafer which comprises;
 a) a vacuum deposition chamber;

b) a generally circular semiconductor wafer in said chamber;

c) wafer support means in said chamber comprising a generally circular susceptor with an outer edge which is inwardly tapered from a larger bottom surface to a top surface which is approximately the same diameter as said wafer;

d) process gas inlet means above said wafer on said susceptor;

e) means for vertically moving said susceptor and wafer thereon toward and away from said gas inlet means;

f) shield means in said chamber comprising a circular shield ring having a tapered circular inner edge with a taper angle approximately equal to the angle of said tapered outer edge of said susceptor, said tapered inner edge of said shield ring extending inwardly from the bottom surface of said ring to the bottom surface of a lip on said shield ring which extends inwardly to engage the frontside edge of said wafer when said wafer and susceptor are vertically moved toward said process gas inlet means to shield said frontside edge of said wafer during CVD processing to prevent deposition on said frontside edge of said wafer; and g) shield ring support means operationally attached to said chamber which permit vertical upward movement of said shield ring off said ring support means as said susceptor and said wafer thereon are vertically moved upward into engagement with the undersurface of said lip on said shield ring; said tapered outer edge of said susceptor and said tapered inner edge of said shield ring cooperating to provide alignment of said shield ring with respect to said susceptor and to permit alignment of said wafer on said susceptor to said susceptor and said shield ring.

38. The apparatus of claim 37 wherein alignment means comprising mating means are respectively carried on the undersurface of said shield ring and the upper surface of said ring support means to circularly align said shield ring to said ring support means.

39. The apparatus of claim 38 wherein said mating means comprises a pin with a tapered head and a corresponding tapered slot to receive said tapered pin.

40. The apparatus of claim 39 wherein said shield ring has an outer tapered edge which mates with a tapered surface on said ring support means to provide a purging gas passage therebetween when said shield ring is lifted off said ring support means by said susceptor and said wafer, whereby purging gas introduced into said chamber below said wafer may pass through said purging gas passage into the upper portion of said chamber.

* * * * *